(12) United States Patent
Joo et al.

(10) Patent No.: US 12,295,200 B2
(45) Date of Patent: May 6, 2025

(54) LIGHT-EMITTING DEVICE WITH IMPROVED LIGHT EMISSION EFFICIENCY AND DISPLAY APPARATUS INCLUDING THE SAME

(71) Applicant: SAMSUNG ELECTRONICS CO., LTD., Suwon-si (KR)

(72) Inventors: Wonjae Joo, Seongnam-si (KR); Hyun Koo, Seongnam-si (KR); Ajeong Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 355 days.

(21) Appl. No.: 17/468,146

(22) Filed: Sep. 7, 2021

(65) Prior Publication Data
US 2022/0285643 A1   Sep. 8, 2022

(30) Foreign Application Priority Data

Mar. 3, 2021 (KR) .................. 10-2021-0028354

(51) Int. Cl.
*H10K 50/852* (2023.01)
*H10K 50/13* (2023.01)
(Continued)

(52) U.S. Cl.
CPC ............ *H10K 50/13* (2023.02); *H10K 50/15* (2023.02); *H10K 50/16* (2023.02); *H10K 50/852* (2023.02);
(Continued)

(58) Field of Classification Search
CPC ........ H10K 50/13; H10K 50/15; H10K 50/16; H10K 50/852; H10K 50/856;
(Continued)

(56) References Cited

U.S. PATENT DOCUMENTS 6,326,224 B1 * 12/2001 Xu ....................... H10K 50/852
438/70
6,917,159 B2    7/2005 Tyan et al.
(Continued)

FOREIGN PATENT DOCUMENTS

EP       1608029 A2    12/2005
JP       2013-51155 A   3/2013
(Continued)

OTHER PUBLICATIONS

US 9,997,732 B2, 06/2018, Wu (withdrawn)
(Continued)

*Primary Examiner* — Shouxiang Hu
(74) *Attorney, Agent, or Firm* — Sughrue Mion, PLLC

(57) ABSTRACT

A light-emitting device includes: a reflective layer; a first electrode provided on the reflective layer; a second electrode facing the first electrode; a first emission layer provided between the first electrode and the second electrode; a second emission layer provided between the first emission layer and the second electrode, and a first partial transmission mirror provided between the first emission layer and the second emission layer so that a first or higher order resonance mode is formed between the reflective layer and the first partial transmission mirror, and a second or higher order resonance mode is formed between the reflective layer and the second electrode.

25 Claims, 14 Drawing Sheets

(51) Int. Cl.
*H10K 50/15* (2023.01)
*H10K 50/16* (2023.01)
*H10K 50/856* (2023.01)
*H10K 102/00* (2023.01)

(52) U.S. Cl.
CPC ..... *H10K 50/856* (2023.02); *H10K 2102/351* (2023.02)

(58) Field of Classification Search
CPC ........... H10K 2102/351; H10K 59/876; H10K 59/878; H10K 50/19; H10K 59/35; H10K 50/11; H10K 59/30
See application file for complete search history.

(56) References Cited

U.S. PATENT DOCUMENTS

| | | | |
|---|---|---|---|
| 2004/0106172 A1 | 8/2004 | Tyan et al. | |
| 2004/0160172 A1 | 8/2004 | Tyan et al. | |
| 2011/0248249 A1* | 10/2011 | Forrest | H10K 50/11 257/40 |
| 2014/0131697 A1 | 5/2014 | Lee et al. | |
| 2014/0159012 A1 | 6/2014 | Song et al. | |
| 2017/0294624 A1* | 10/2017 | Xu | H10K 59/12 |
| 2021/0159462 A1* | 5/2021 | Hamer | H10K 50/13 |

FOREIGN PATENT DOCUMENTS

| | | |
|---|---|---|
| KR | 10-0978584 B1 | 8/2010 |
| KR | 10-2014-0060173 A | 5/2014 |
| KR | 10-2017-0127956 A | 11/2017 |
| WO | 2017/024881 A1 | 2/2017 |

OTHER PUBLICATIONS

Matthew White, David Allemeier, and Ekraj Dahal "Photonic band structure in one-dimensional crystals of stacked microcavity OLEDs", Proc. SPIE 11473, Organic and Hybrid Light Emitting Materials and Devices XXIV, 114730D (Aug. 20, 2020); https://doi.org/10.1117/12.2568129 (Year: 2020).*
Allemeier, D., Isenhart, B., Dahal, E. et al. Emergence and control of photonic band structure in stacked OLED microcavities. Nat Commun 12, 6111 (2021). https://doi.org/10.1038/s41467-021-26440-3 (Year: 2021).*
Communication dated Mar. 1, 2022 issued by the European Patent Office in European Patent Application No. 21194346.9.

* cited by examiner

LIGHT-EMITTING DEVICE WITH IMPROVED LIGHT EMISSION EFFICIENCY AND DISPLAY APPARATUS INCLUDING THE SAME

CROSS-REFERENCE TO RELATED APPLICATION

This application is based on and claims priority under 35 U.S.C. § 119 to Korean Patent Application No. 10-2021-0028354, filed on Mar. 3, 2021, in the Korean Intellectual Property Office, the disclosure of which is incorporated by reference herein in its entirety.

BACKGROUND

1. Field

The disclosure relates to a light-emitting device and a display apparatus including the light-emitting device, and more particularly, to an organic light-emitting device (OLED) with improved light emission efficiency and an organic light-emitting display apparatus.

2. Description of Related Art

An organic light-emitting device (OLED) forms an image via light emission according to a combination of holes supplied from an anode and electrons supplied from a cathode in an organic emission layer. OLEDs have excellent display characteristics such as a wide viewing angle, a fast response speed, a small thickness, low manufacturing costs, and high contrast.

Further, an OLED may emit a particular color according to selection of an appropriate material as a material of the organic emission layer. According to this principle, it is possible to manufacture a color display apparatus by using an OLED.

SUMMARY

Provided are an OLED with improved light emission efficiency and an organic light-emitting display apparatus.

Additional aspects will be set forth in part in the description which follows and, in part, will be apparent from the description, or may be learned by practice of embodiments of the disclosure.

According to an aspect of an example embodiment, there is provided a light-emitting device including: a reflective layer; a first electrode provided on the reflective layer; a second electrode facing the first electrode; a first emission layer provided between the first electrode and the second electrode; a second emission layer provided between the first emission layer and the second electrode, and a first partial transmission mirror is provided between the first emission layer and the second emission layer so that a first or higher order resonance mode is formed between the reflective layer and the first partial transmission mirror, and a second or higher order resonance mode is formed between the reflective layer and the second electrode.

The first electrode may include a transparent electrode and the second electrode may include a partial transmission electrode that reflects a part of light and transmits another part of the light.

The reflective layer and the second electrode may constitute a micro cavity having a resonance wavelength, and the first partial transmission mirror may be provided at a node of a light wave resonating within the micro cavity.

The first partial transmission mirror may include silver (Ag), aluminum (Al), silver alloy, or aluminum alloy.

A thickness of the first partial transmission mirror may be about 5 nm to about 30 nm.

A thickness of the second electrode may be different from the thickness of the first partial transmission mirror.

The first emission layer may include: a first hole transfer layer provided on the first electrode; a first organic emission material layer provided on the first hole transfer layer; and a first electron transfer layer provided on the first organic emission material layer, and the second emission layer may include: a second hole transfer layer provided on the first partial transmission mirror; a second organic emission material layer provided on the second hole transfer layer; and a second electron transfer layer provided on the second organic emission material layer.

The light-emitting device may further include a transparent conductor layer on the first partial transmission mirror to face the second electrode.

The light-emitting device may further include a charge generation layer provided between the first emission layer and the second emission layer.

The light-emitting device may further include: a third emission layer provided between the second emission layer and the second electrode; and a second partial transmission mirror provided between the second emission layer and the third emission layer.

The first partial transmission mirror and the second partial transmission mirror may be arranged so that a first order resonance mode may be formed between the reflective layer and the first partial transmission mirror, a second order resonance mode may be formed between the reflective layer and the second partial transmission mirror, and a third order resonance may be formed between the reflective layer and the second electrode.

The reflective layer and the second electrode may constitute a micro cavity having a resonance wavelength, the first partial transmission mirror may be provided at a first node of a light wave resonating in the micro cavity, and the second partial transmission mirror may be provided at a second node of the light wave resonating in the micro cavity.

According to an aspect of an example embodiment, there is provided a light-emitting device including: a reflective layer; a first electrode on the reflective layer; a second electrode facing the first electrode; a phase correction layer provided between the first electrode and the second electrode; a first emission layer provided between the first electrode and the phase correction layer; a second emission layer provided between the phase correction layer and the second electrode; a first partial transmission mirror provided between the phase correction layer and the first emission layer; and a second partial transmission mirror provided between the phase correction layer and the second emission layer, wherein the first partial transmission mirror and the second partial transmission mirror are arranged such that a first or higher order resonance mode is formed between the reflective layer and the first partial transmission mirror, and a second or higher order resonance mode is formed between the reflective layer and the second electrode.

The first electrode may include a transparent electrode and the second electrode may include a partial transmission electrode that reflects a part of light and transmits another part of the light.

The reflective layer and the second electrode may constitute a micro cavity having a resonance wavelength, and the phase correction layer may be located at a node of a light wave resonating within the micro cavity.

The reflective layer, the second electrode, the first partial transmission mirror, and the second partial transmission mirror may cause a phase modulation greater than 180 degrees to occur with respect to light reflected by the reflective layer, the second electrode, the first partial transmission mirror, and the second partial transmission mirror.

The phase correction layer may include a transparent conductive material.

A thickness of the phase correction layer may be about 5 nm to about 150 nm.

Each of the first partial transmission mirror and the second partial transmission mirror may include silver (Ag), aluminum (Al), silver alloy, or aluminum alloy.

Each of the first partial transmission mirror and the second partial transmission mirror has a thickness of about 5 nm to about 30 nm.

An optical distance between the reflective layer and the first partial transmission mirror may be set so that a first or second order resonance mode is formed between the reflective layer and the first partial transmission mirror, and an optical distance between the second partial transmission mirror and the second electrode may be set so that the first or second order resonance mode is formed between the second partial transmission mirror and the second electrode.

The first emission layer may include: a first hole transfer layer provided on the first electrode; a first organic emission material layer provided on the first hole transfer layer; and a first electron transfer layer provided on the first organic emission material layer, and the second emission layer may include: a second hole transfer layer provided on the second partial transmission mirror; a second organic emission material layer provided on the second hole transfer layer; and a second electron transfer layer provided on the second organic emission material layer.

The first organic emission material layer and the second organic emission material layer generate light of a same wavelength.

An optical distance between the reflective layer and the first partial transmission mirror may be set so that a resonance mode is formed with respect to a wavelength of light generated from the first organic emission material layer, and an optical distance between the second partial transmission mirror and the second electrode may be set so that a resonance mode is formed with respect to a wavelength of light generated from the second organic emission material layer.

The first organic emission material layer may generate light of a first wavelength, and the second organic emission material layer may generate light of a second wavelength different from the first wavelength.

An optical distance between the reflective layer and the first partial transmission mirror may be set so that a resonance mode is formed with respect to the first wavelength, and an optical distance between the second partial transmission mirror and the second electrode may be set so that a resonance mode is formed with respect to the second wavelength.

According to an aspect of an example embodiment, there is provided a display apparatus including: a plurality of pixels, wherein each of the plurality of pixels may include: a reflective layer; a first electrode provided on the reflective layer; a second electrode facing the first electrode; a first emission layer provided between the first electrode and the second electrode; a second emission layer provided between the first emission layer and the second electrode; and a partial transmission mirror provided between the first emission layer and the second emission layer so that a first or higher order resonance mode is formed between the reflective layer and the partial transmission mirror, and a second or higher order resonance mode is formed between the reflective layer and the second electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
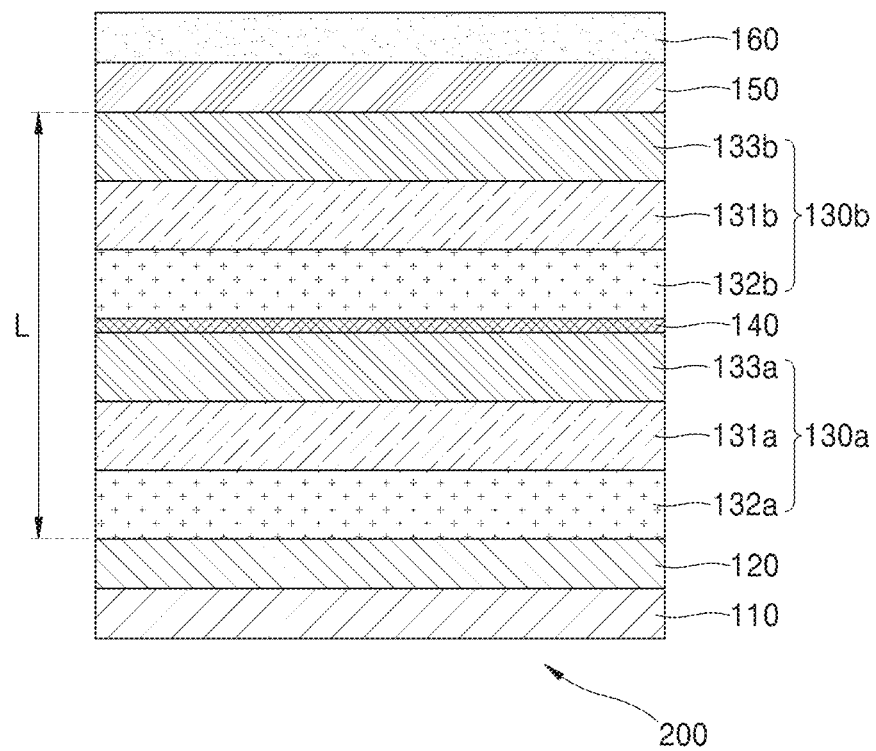
FIG. 1 is a cross-sectional view schematically illustrating a structure of a light-emitting device according to an embodiment.

Reference will now be made in detail to embodiments, examples of which are shown in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, with reference to the accompanying drawings, a light-emitting device and a display apparatus including the light-emitting device will be described in detail. Like reference numerals refer to like elements throughout, and in the drawings, sizes of elements may be exaggerated for clarity and convenience of explanation. The embodiments described below are merely examples, and various modifications may be possible from the embodiments.

In a layer structure described below, an expression "above" or "on" may include not only "immediately on in a contact manner" but also "on in a non-contact manner". An expression used in the singular encompasses the expression of the plural, unless it has a clearly different meaning in the context. It will be further understood that the terms "comprises", "comprising", "includes", and/or "including" used herein specify the presence of stated features or elements, but do not preclude the presence or addition of one or more other features or elements.

The use of "the" and other demonstratives similar thereto may correspond to both a singular form and a plural form. Unless the order of operations of a method according to the disclosure is explicitly mentioned or described otherwise, the operations may be performed in a proper order. The disclosure is not limited to the order the operations mentioned.

The term used in the embodiments such as "unit" or "module" indicates a unit for processing at least one function or operation, and may be implemented in hardware or software, or in a combination of hardware and software.

The connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language provided herein, is intended merely to better illuminate the disclosure and does not pose a limitation on the scope of the disclosure unless otherwise claimed.

FIG. 1 is a cross-sectional view schematically illustrating a structure of a light-emitting device 200 according to an embodiment. Referring to FIG. 1, the light-emitting device 200 according to an embodiment may include a reflective layer 110, a first electrode 120 disposed on the reflective layer 110, a second electrode 150 disposed to face the first electrode 120, a partial transmission mirror 140 disposed between the first electrode 120 and the second electrode 150, a first emission layer 130a disposed between the first electrode 120 and the partial transmission mirror 140, and a second emission layer 130b disposed between the partial transmission mirror 140 and the second electrode 150. The light-emitting device 200 may further include a transparent passivation layer 160 disposed on the second electrode 150 to protect the second electrode 150.

The light-emitting device 200 may be an organic light-emitting device, also known as an organic light-emitting diode, (OLED). The first emission layer 130a and the second emission layer 130b may be organic emission layers including an organic light-emitting material. For example, the first emission layer 130a may include a first hole transfer layer 132a disposed on the first electrode 120, a first organic emission material layer 131a disposed on the first hole transfer layer 132a, and a first electron transfer layer 133a disposed on the first organic emission material layer 131a. The second emission layer 130b may include a second hole transfer layer 132b disposed on the partial transmission mirror 140, a second organic emission material layer 131b disposed on the second hole transfer layer 132b, and a second electron transfer layer 133b disposed on the second organic emission material layer 131b.

The first and second hole transfer layers 132a and 132b may further perform a function of a hole injection layer, and the first and second electron transfer layers 133a and 133b may further perform a function of an electron injection layer. Separate additional hole injection layers may be disposed between the first electrode 120 and the first hole transfer layer 132a and between the partial transmission mirror 140 and the second hole transfer layer 132b, and separate additional electron injection layers may be disposed between the first electron transfer layer 133a and the partial transmission mirror 140 and between the second electron transfer layer 133b and the second electrode 150. Further, the first and second emission layers 130a and 130b may further include various additional layers as necessary. For example, the first and second emission layers 130a and 130b may further include an electron block layer, a hole block layer, etc.

In this structure, holes provided through the first and second hole transfer layers 132a and 132b and electrons provided through the first and second electron transfer layers 133a and 133b are combined in the first and second organic emission material layers 131a and 131b to generate light. The first and second organic emission material layers 131a and 131b may be formed by doping an organic host with a dopant material. The wavelength of light generated from the first and second organic emission material layers 131a and 131b may be determined based on characteristics of the organic host and the dopant material.

The first electrode 120 may serve as an anode providing holes to the first and second emission layers 130a and 130b, and the second electrode 150 may serve as a cathode providing electrons to the first and second emission layers 130a and 130b. To this end, the first electrode 120 may include a material having a relatively high work function, and the second electrode 150 may include a material having a relatively low work function.

In addition, the first electrode 120 may be a transparent electrode having a property of transmitting light (e.g., visible light). For example, the first electrode 120 may include a transparent conductive oxide such as indium tin oxide (ITO), indium zinc oxide (IZO), and aluminum zinc oxide (AZO).

The second electrode 150 may be a partial transmission electrode that reflects part of light and transmits the other part thereof. To this end, the second electrode 150 may include a very thin reflective metal. For example, the second electrode 150 may include silver (Ag), aluminum (Al), a silver alloy, or an aluminum alloy. For example, the silver alloy may include a mixing layer of silver (Ag) and magnesium (Mg), and the aluminum alloy may include a mixing layer of aluminum (Al) and lithium (Li). The total thickness of the second electrode 150 may be about 5 nm to about 30 nm. Because the thickness of the second electrode 150 is very thin, a part of light may pass through the reflective metal.

The reflective layer 110 may be configured to reflect the light generated by the first and second emission layers 130a and 130b and transmitted through the first electrode 120. To this end, the reflective layer 110 may include silver (Ag), gold (Au), aluminum (Al), or an alloy including these. However, the disclosure is not limited thereto, and the reflective layer 110 may include other reflective materials.

The reflective layer 110 serves to form a micro cavity together with the second electrode 150. In other words, the micro cavity is formed between the reflective layer 110 and the second electrode 150 of the light-emitting device 200. For example, the light generated from the first and second emission layers 130a and 130b may reciprocate and resonate between the reflective layer 110 and the second electrode 150, and then light corresponding to a resonance wavelength of the micro cavity may be emitted to the outside through the second electrode 150.

The resonance wavelength of the micro cavity formed between the reflective layer 110 and the second electrode 150 may be determined by an optical length L of the micro cavity. For example, when the resonance wavelength of the micro cavity is $\lambda$, the optical length L of the micro cavity may be $n\lambda/2$ (n is a natural number). The optical length L of the micro cavity may be determined based on the sum of optical thicknesses of layers forming the micro cavity between the reflective layer 110 and the second electrode 150, a phase delay due to the second electrode 150, and a phase delay due to the reflective layer 110. Here, the optical thicknesses of layers forming the micro cavity between the reflective layer 110 and the second electrode 150 are not simple physical thicknesses, but thicknesses in consideration of refractive indexes of materials of the layers forming the micro cavity. For example, the optical thicknesses of the layers forming the micro cavity is the sum of optical thicknesses of all the layers between the reflective layer 110 and the second electrode 150.

In order to improve the emission efficiency of the light-emitting device 200, the optical length L of the micro cavity may be determined to match the resonance wavelength of the micro cavity with emission wavelengths of the first and second emission layers 130a and 130b. In other words, the resonance wavelength $\lambda$ of the micro cavity may be the same as the emission wavelengths of the first and second emission layers 130a and 130b. To this end, the optical thicknesses of the layers disposed between the reflective layer 110 and the second electrode 150 may be adjusted in consideration of the emission wavelengths of the first and second emission layers 130a and 130b. By using such a micro cavity, the light-emitting device 200 may emit light in a single straight direction and only within a narrow wavelength band, and thus a color purity of the light emitted from the light-emitting device 200 may be increased.

Meanwhile, in a micro cavity structure, a radiative decay rate of a light source in the micro cavity varies under the influence of a Q-factor and mode volume of the micro cavity, which is called the Purcell effect. Enhancing the Purcell effect may increase the radiative decay rate of the light source and improve a spontaneous emission rate. In an organic light-emitting device, the light source means a light-emitting dopant, and a photoluminescence quantum yield (PLQY) of the dopant is increased by the Purcell effect, thereby further improving the emission efficiency of the device. Even though the PLQY of the dopant is close to 1, increasing the radiative decay rate due to the Purcell effect by the micro cavity may result in an increase in the expected lifetime of the light-emitting device.

In general, the Purcell effect is strong in a first order resonance mode where n=1, that is, the optical length L of the micro cavity is $\lambda/2$, and decreases rapidly as n increases and a resonance order increases. This is because, as the length of a resonator increases, a free spectral range decreases, and an optical density of state (ODOS) formed by the micro cavity is reduced, which reduces the efficiency of an illuminant inside the micro cavity. Therefore, although it is most efficient to apply the micro cavity having the first order resonance mode to the light-emitting device, a higher order resonance mode may be applied when the thickness of a hole transfer layer or an emission layer needs to increase for the driving stability of the light-emitting device, when multiple emission layers are applied, or when a tandem structure in which a plurality of light-emitting devices are stacked is applied.

Figure 2:
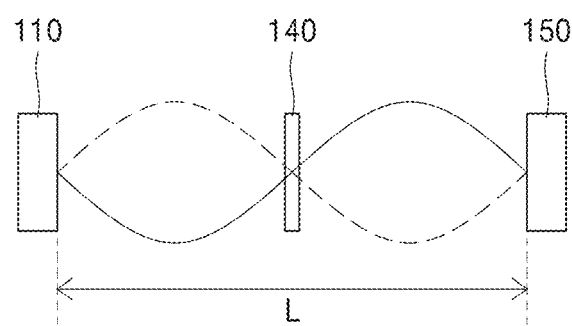
FIG. 2 is a conceptual diagram illustrating a micro cavity structure of the light-emitting device shown in FIG. 1.

According to the present embodiment, the partial transmission mirror 140 inside the micro cavity serves to enhance the Purcell effect by causing a micro cavity having a second or higher order resonance mode to have a first order resonance mode. For example, FIG. 2 is a conceptual diagram illustrating a micro cavity structure of the light-emitting device 200 shown in FIG. 1. Referring to FIG. 2, a micro cavity having a second order resonance mode is formed by the reflective layer 110 and the second electrode 150. The partial transmission mirror 140 is disposed in a region in which an electric field strength of a light wave resonating inside the micro cavity is the smallest, that is, at a node of the light wave resonating inside the micro cavity. Then, a part of light incident on the partial transmission mirror 140 is reflected by the partial transmission mirror 140 to form a new smaller resonator. Accordingly, a plurality of resonance modes may be formed in the micro cavity.

Figure 3A:
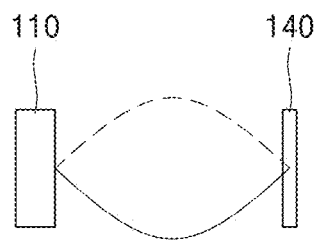
FIGS. 3A and 3B illustrate examples of resonance modes of a micro-cavity of the light-emitting device shown in FIG. 1.
Figure 3B:
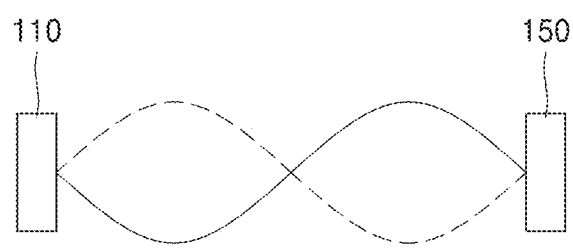

FIGS. 3A and 3B illustrate examples of resonance modes of a micro-cavity of the light-emitting device 200 shown in FIG. 1. First, referring to FIG. 3A, a resonator having a first order resonance mode may be formed by the reflective layer 110 and the partial transmission mirror 140. In addition, as shown in FIG. 3B, a resonator having a second order resonance mode may be formed by the reflective layer 110 and the second electrode 150. As described above, the partial transmission mirror 140 is further disposed in the micro cavity, and thus the micro cavity may further have a first order resonance mode, thereby increasing an ODOS. A first order resonator having the first order resonance mode may also be formed by the partial transmission mirror 140 and the second electrode 150. Accordingly, two first order resonators having the first order resonance mode are connected to form one second order resonator having the second order resonance mode.

The partial transmission mirror 140 may include the same material as the second electrode 150. In other words, the partial transmission mirror 140 may include a reflective and conductive metal material, for example, silver (Ag), aluminum (Al), silver alloy, or aluminum alloy. The partial transmission mirror 140 may be formed to have a thin thickness by which a part of light may be transmitted. For example, the partial transmission mirror 140 may have a thickness of about 5 nm to about 30 nm. If necessary, a thickness of the partial transmission mirror 140 may be selected differently from a thickness of the second electrode 150 that emits light to the outside of the light-emitting device 200. In other words, a reflectivity of the partial transmission mirror 140 may be selected differently from a reflectivity of the second electrode 150.

In addition, the first emission layer 130a disposed between the reflective layer 110 and the partial transmission mirror 140 may be located in a region in which an electric field strength of a light wave resonating inside the micro cavity is the largest, that is, at an antinode of the light wave resonating inside the micro cavity. Thicknesses and materials of an electron transfer layer and a hole transfer layer may be selected so that holes and electrons injected from electrodes may efficiently generate excitons in an emission layer. It may be optically most advantageous that the emission layer is located at the antinode of the micro cavity. The second emission layer 130b disposed between the partial transmission mirror 140 and the second electrode 150 may also be located at the antinode of the light wave resonating inside the micro cavity.

Figure 4:
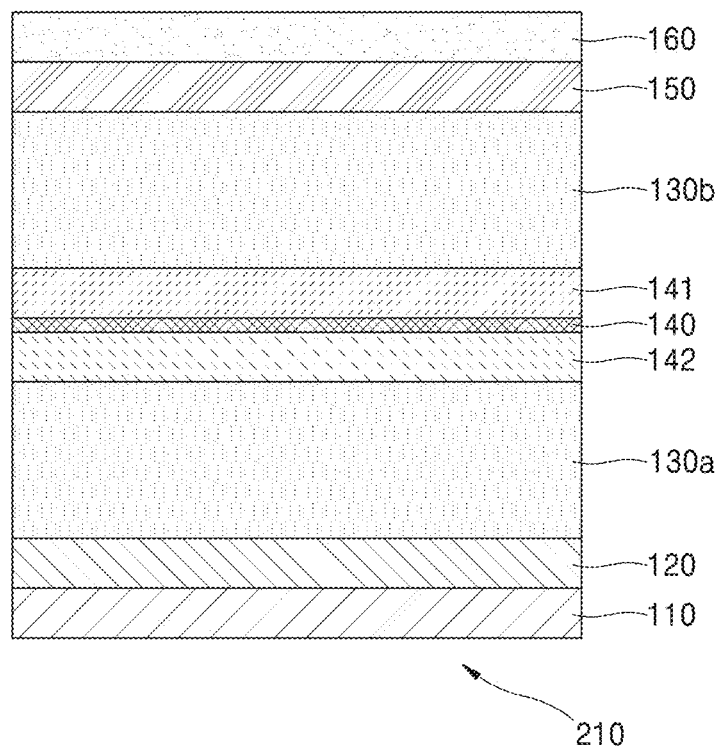
FIG. 4 is a cross-sectional view schematically illustrating a structure of a light-emitting device according to an embodiment.

FIG. 4 is a cross-sectional view schematically illustrating a structure of a light-emitting device 210 according to an embodiment. Referring to FIG. 4, the light-emitting device 210 may further include a transparent conductor layer 141 disposed on an upper surface of the partial transmission mirror 140 to face the second electrode 150. The transparent conductor layer 141 may act similarly to the first electrode 120. The transparent conductor layer 141 positioned between the partial transmission mirror 140 and the second emission layer 130b may include a material having a high work function to provide holes to the second emission layer 130b. For example, the transparent conductor layer 141 may include ITO, IZO, AZO, etc.

In addition, the light-emitting device 210 may further include a charge generation layer 142 disposed between the first emission layer 130a and the second emission layer 130b. The charge generation layer 142 may serve to improve charge transfer between the first organic emission material layer 131a and the second organic emission material layer 131b. FIG. 4 illustrates that the charge generation layer 142 is disposed between a lower surface of the partial transmission mirror 140 and an upper surface of the first emission layer 130a, but is not limited thereto, and the charge generation layer 142 may be positioned between the first emission layer 130a and the second emission layer 130b.

The remaining configurations of the light-emitting device 210 may be the same as those of the light-emitting device 200 shown in FIG. 1. Therefore, further detailed description of the light-emitting device 210 shown in FIG. 4 will be omitted.

Figure 5:
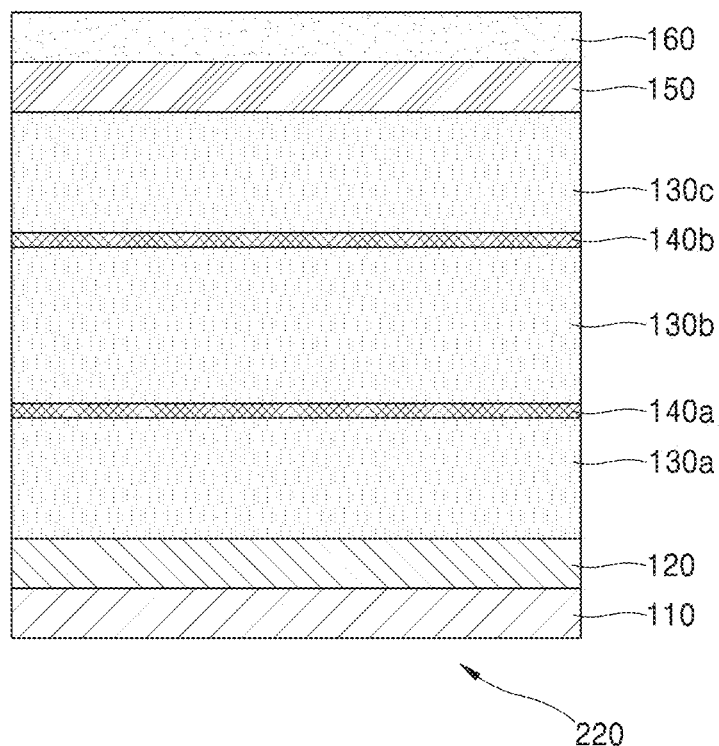
FIG. 5 is a cross-sectional view schematically illustrating a structure of a light-emitting device according to an embodiment.

FIG. 5 is a cross-sectional view schematically illustrating a structure of a light-emitting device 220 according to an embodiment. Referring to FIG. 5, the light-emitting device 220 may include the reflective layer 110, the transparent first electrode 120 disposed on the reflective layer 110, the first emission layer 130a disposed on the first electrode 120, a first partial transmission mirror 140a disposed on the first emission layer 130a, the second emission layer 130b disposed on the first partial transmission mirror 140a, a second partial transmission mirror 140b disposed on the second emission layer 130b, a third emission layer 130c disposed on the second partial transmission mirror 140b, and the second electrode 150 disposed on the third emission layer 130c. In addition, the light-emitting device 220 may further include the passivation layer 160 disposed on the second electrode 150.

Compared with the light-emitting devices 200 and 210 shown in FIGS. 1 and 4, the light-emitting device 220 may further include the third emission layer 130c disposed between the second emission layer 130b and the second electrode 150, and the second partial transmission mirror 140b disposed between the second emission layer 130b and the third emission layer 130c. Although the micro cavity of the light-emitting devices 200 and 210 shown in FIGS. 1 and 4 is configured to have a second order resonance mode, the micro cavity of the light-emitting device 220 shown in FIG. 5 has a third order resonance mode. In addition, a resonance order of the micro-cavity is not limited thereto, and the micro-cavity may be formed to have a fourth or higher order resonance mode.

Figure 6:
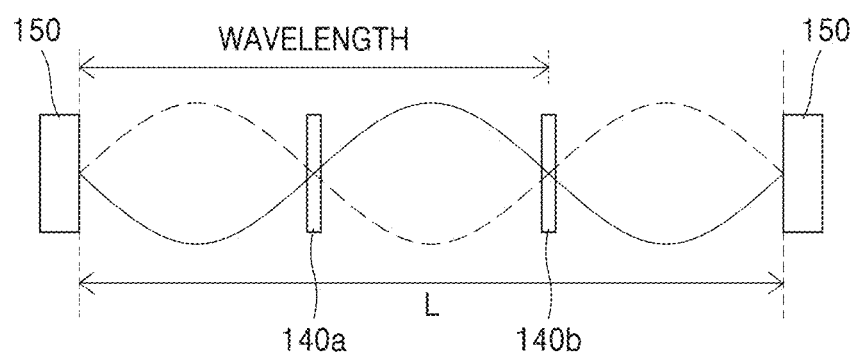
FIG. 6 is a conceptual diagram illustrating a micro cavity structure of the light-emitting device shown in FIG. 5.

FIG. 6 is a conceptual diagram illustrating a micro cavity structure of the light-emitting device 220 shown in FIG. 5. Referring to FIG. 6, a micro cavity having a third order resonance mode is formed between the reflective layer 110 and the second electrode 150. The first partial transmission mirror 140a disposed between the first emission layer 130a and the second emission layer 130b may be located in a first node region of a light wave resonating in the micro cavity, and the second partial transmission mirror 140b disposed between the second emission layer 130b and the third emission layer 130c may be located in a second node region of the light wave resonating in the micro cavity. In this case, the first emission layer 130a may be located in a first antinode region of the light wave resonating in the micro cavity, the second emission layer 130b may be located in a second antinode region of the light wave resonating in the micro cavity, and the third emission layer 130c may be located in a third antinode region of the light wave resonating in the micro cavity.

Figure 7A:
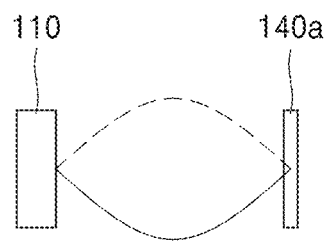
FIGS. 7A to 7C illustrate examples of resonance modes of a micro-cavity of the light-emitting device shown in FIG. 5.
Figure 7B:
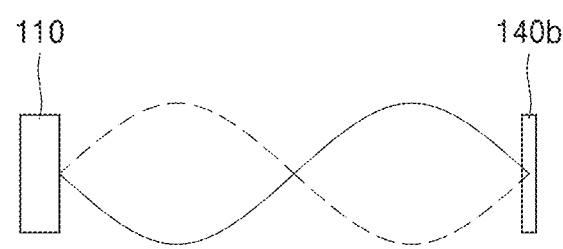
Figure 7C:
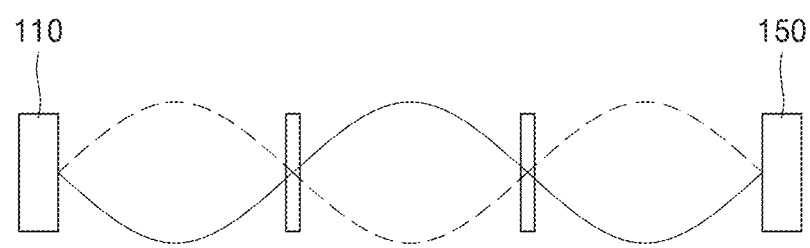

FIGS. 7A to 7C illustrate examples of resonance modes of a micro-cavity of the light-emitting device 220 shown in FIG. 5. Referring to FIGS. 7A to 7C, a first order resonance mode may be formed between the reflective layer 110 and the first partial transmission mirror 140a, a second order resonance may be formed between the reflective layer 110 and the second partial transmission mirror 140b, and a third order resonance mode may be formed between the reflective layer 110 and the second electrode 150. Such multiple resonance modes are formed by placing the first and second partial transmission mirrors 140a and 140b in different node regions of a light wave resonating in the micro cavity as shown in FIG. 6.

Figure 8:
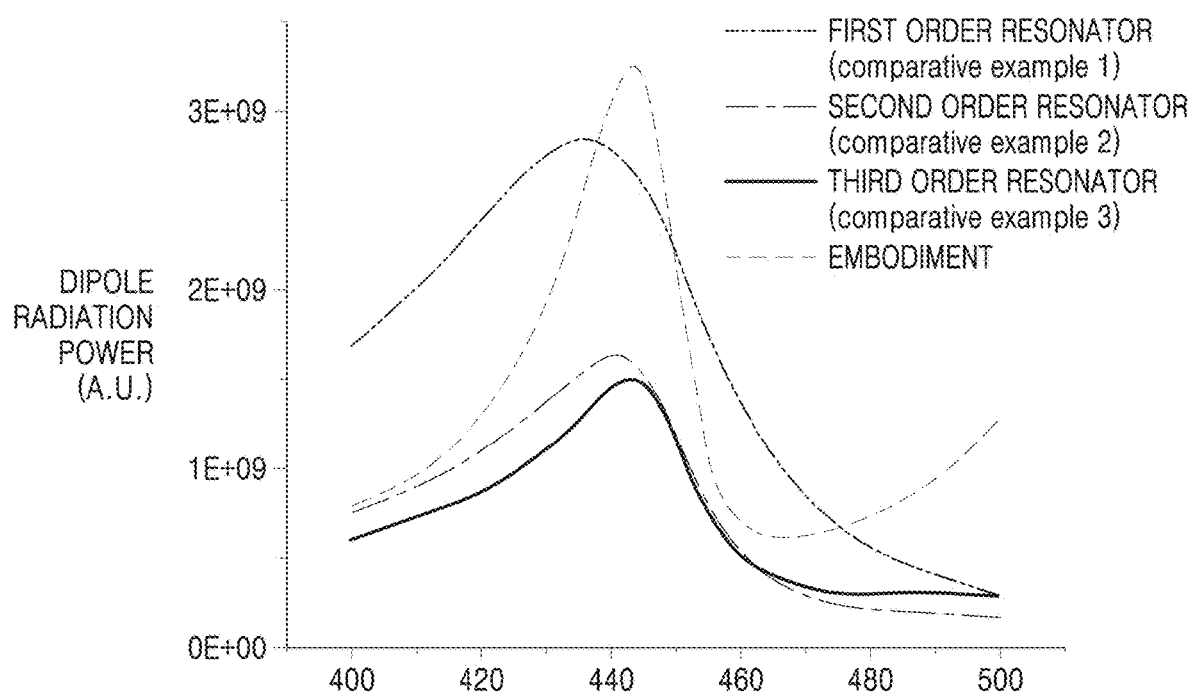
FIG. 8 is a graph illustrating an example of a change in emission characteristics of an illuminant according to a resonance order in the light-emitting device shown in FIG. 5 compared with comparative examples.
Figure 9:
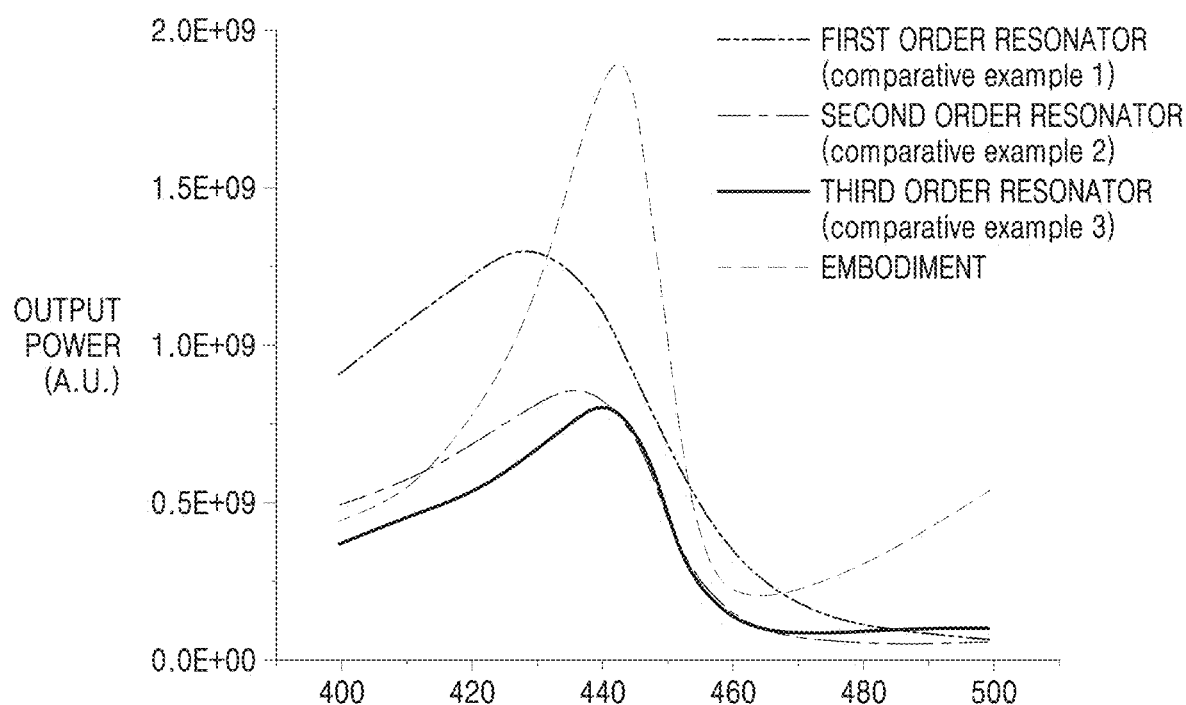
FIG. 9 is a graph illustrating an example of a change in light emission characteristics of the light-emitting device according to a resonance order in the light-emitting device shown in FIG. 5 compared with comparative examples.

As described above, a plurality of small resonators may be additionally formed in one large micro cavity, and may be optically connected to each other. Then, an optical effect may be obtained through the interaction of first, second, and third order resonance. For example, FIG. 8 is a graph illustrating an example of a change in emission characteristics of an illuminant according to a resonance order in the light-emitting device 220 shown in FIG. 5 compared with comparative examples, and FIG. 9 is a graph illustrating an example of a change in light emission characteristics of the light-emitting device 220 according to a resonance order in the light-emitting device 220 shown in FIG. 5 compared with comparative examples. In other words, the graph of FIG. 8 shows an intensity of light generated by the illuminant located in the micro cavity compared to the comparative examples, and the graph of FIG. 9 shows an intensity of light resonating in the micro cavity and emitted to the outside of the light-emitting device 220 through the second electrode 140 compared to the comparative examples.

Referring to FIG. 8, it may be seen that the intensity of the light generated by the illuminant decreases as a resonance order increases from a first order resonance mode to a second order resonance mode and to a third order resonance mode. This may be interpreted as a result of the Purcell effect described above. Meanwhile, as in the present embodiment, it may be seen that when the first and second partial transmission mirrors 140a and 140b are used to additionally generate the first and second order resonance modes in the micro cavity, the emission characteristics of the illuminant are further improved compared to the case of having only the first order resonance mode. This may be seen as a result of reinforcing characteristics by mutual constructive interference of various resonance modes. In addition, referring to FIG. 9, the intensity of the light emitted to the outside of the light-emitting device 220 according to the embodiment is improved by about twice as compared to the case of having only the first order resonance mode, and thus it may be predicted that a light extraction efficiency is also improved.

As described above, the partial transmission mirrors 140, 140a, and 140b may be disposed so that a first or higher order resonance mode is formed between the reflective layer 110 and the partial transmission mirrors 140, 140a, and 140b, and a second or higher order resonance mode is formed between the reflective layer 110 and the second electrode 150. Then, even when a micro cavity-based light-emitting device includes multiple emission layers or a thick organic layer to form a second or higher order resonance mode, a first order resonance condition may be satisfied by a partial transmission mirror inside the micro cavity. As a result, it may be expected that the efficiency may be further improved or the driving life of the light-emitting device may be increased owing to an increase in the Purcell effect.

Figure 10:
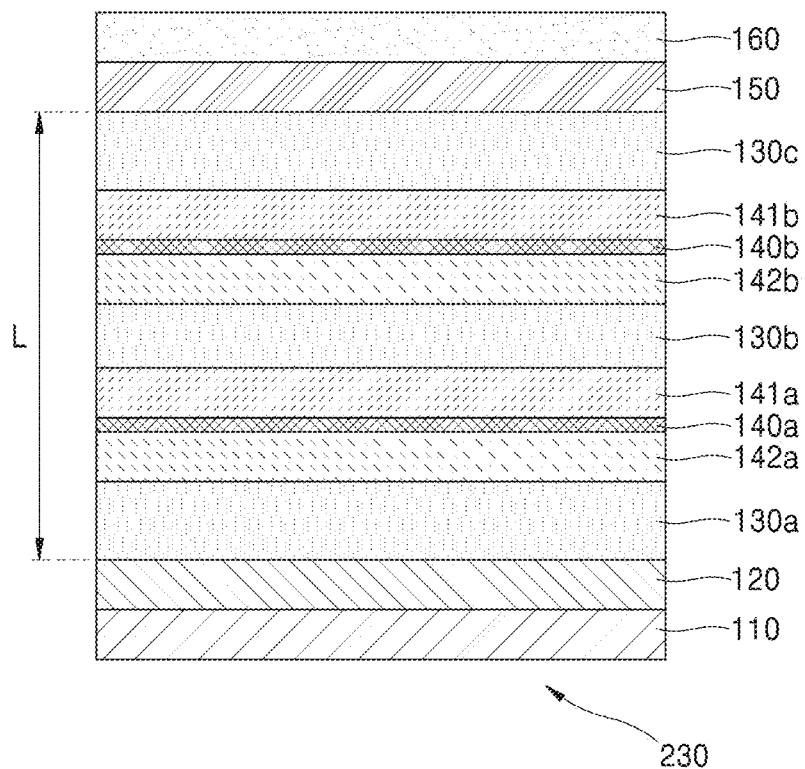
FIG. 10 is a cross-sectional view schematically illustrating a structure of a light-emitting device according to an embodiment.

FIG. 10 is a cross-sectional view schematically illustrating a structure of a light-emitting device 230 according to an embodiment. Referring to FIG. 10, the light-emitting device 230 may further include a first transparent conductor layer 141a disposed between an upper surface of the first partial transmission mirror 140a and the second emission layer 130b and a second transparent conductor layer 141b disposed between an upper surface of the second partial transmission mirror 140b and the third emission layer 130c. In addition, the light-emitting device 230 may further include a first charge generation layer 142a disposed between the first emission layer 130a and the second emission layer 130b and a second charge generation layer 142b disposed between the second emission layer 130b and the third emission layer 130c. Other configurations of the light-emitting device 230 shown in FIG. 10 are the same as those of the light-emitting device 220 shown in FIG. 5, and thus detailed descriptions thereof will be omitted.

Figure 11:
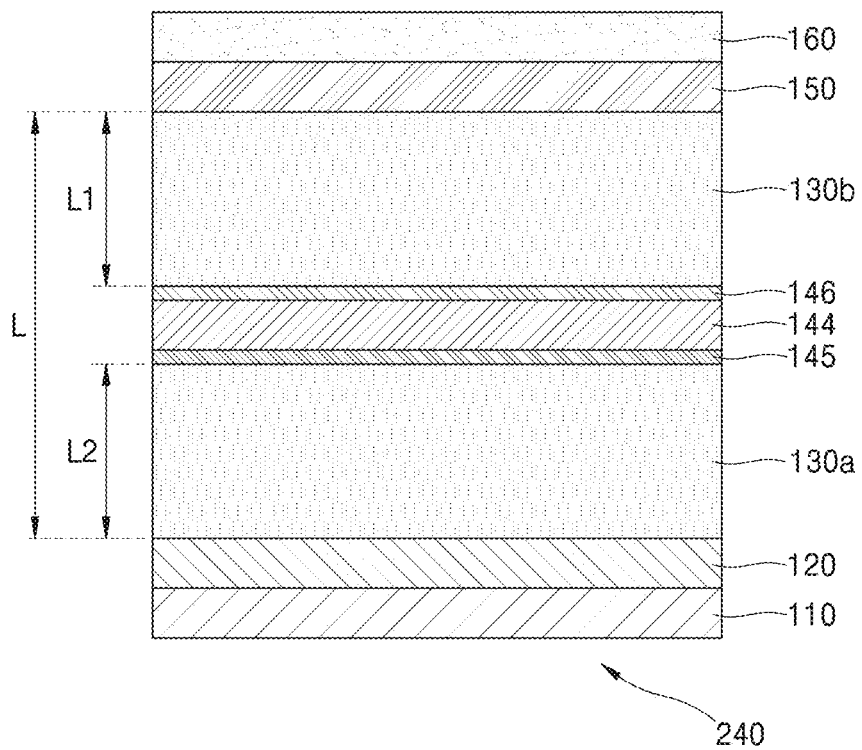
FIG. 11 is a cross-sectional view schematically illustrating a structure of a light-emitting device according to an embodiment.

FIG. 11 is a cross-sectional view schematically illustrating a structure of a light-emitting device 240 according to an embodiment. Referring to FIG. 11, the light-emitting device 240 may include the reflective layer 110, the transparent first electrode 120 disposed on the reflective layer 110, the second electrode 150 disposed facing the first electrode 120 and having partial transmittance, a phase correction layer 144 disposed between the first electrode 120 and the second electrode 150, the first emission layer 130a disposed between the first electrode 120 and the phase correction layer 144, the second emission layer 130b disposed between the phase correction layer 144 and the second electrode 150, a first partial transmission mirror 145 disposed between the phase correction layer 144 and the first emission layer 130a, and a second partial transmission mirror 146 disposed between the phase correction layer 144 and the second emission layer 130b. In addition, the light-emitting device 240 may further include the passivation layer 160 disposed on the second electrode 150.

In FIGS. 1 to 10, it is assumed that a phase of light reflected by the reflective layer 110, the second electrode 150, and the partial transmission mirrors 140, 140a, and 140b is changed by 180 degrees (i.e., π). However, in the case of a metal mirror, a phase modulation about 1.1 times to about 1.3 times actually occurs due to an evanescent wave effect. For example, in a silver (Ag) mirror, a phase modulation of 1.3×180 degrees occurs. Due to this, an optical length of a first order resonator may actually be shorter than λ/2. For example, when a resonance wavelength is 450 nm, an actual optical length of the first order resonator is not about 225 nm, but about 170 nm. The reason that the length of a resonator is reduced by about 55 nm is that a reflection phase modulation by a silver thin film is 1.37 instead of π.

Such a phase modulation greater than π occurring in the metal mirror may make it difficult to connect a plurality of first order resonators in series. When two first order resonators configured in consideration of phase modulation greater than π are connected in series, the length of the resulting resonator is shorter than the length that satisfies a second order resonance condition, and the actual resonance wavelength of the resulting resonator is shorter than a target resonance wavelength. For example, when two first order resonators having a resonance wavelength of 450 nm are connected in series, a second order resonator may have a resonance wavelength of about 420 nm. When three first order resonators configured in consideration of phase modulation greater than π are connected in series, the length of the resulting resonator is shorter than the length that satisfies a third order resonance condition. For this reason, constructive interference may not occur between various resonance modes that satisfy the resonance conditions of a plurality of resonators.

The light-emitting device 240 shown in FIG. 11 may thus further include an additional cavity for correcting a phase in the micro cavity so that the length of the second or higher order resonator is not shortened. The phase correction layer 144 may serve as such an additional cavity for correcting a phase without directly contributing to light emission. The phase correction layer 144 may connect the first order resonators disposed on both sides of the phase correction layer 144 in series and match the resonance wavelength of the final second or higher order resonator with a target resonance wavelength. In other words, the resonance wavelength of the final second or higher order resonator may be determined based on a thickness of the phase correction layer 144. The exact thickness of the phase correction layer 144 matching the resonance wavelength of the final second or higher resonator to the target resonance wavelength may be calculated using, for example, a finite-differential time-domain simulator.

Figure 12A:
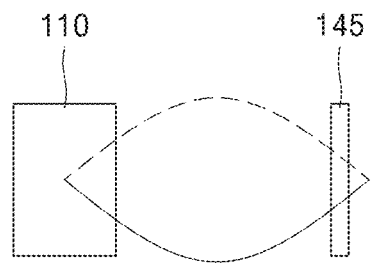
FIGS. 12A to 12C illustrate examples of resonance modes of a micro-cavity of the light-emitting device shown in FIG. 11.
Figure 12B:
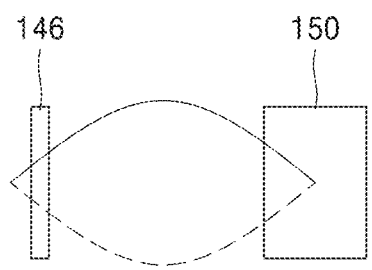
Figure 12C:
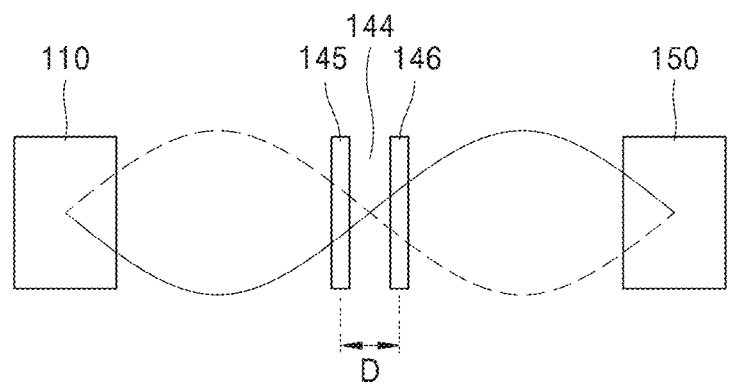

FIGS. 12A to 12C illustrate examples of resonance modes of a micro cavity of the light-emitting device 240 shown in FIG. 11. Referring to FIG. 12A, a first order resonator is formed by the reflective layer 110 and the first partial transmission mirror 145. In addition, referring to FIG. 12B, another first order resonator is formed by the second partial transmission mirror 146 and the second electrode 150. In addition, referring to FIG. 12C, a second order resonator is formed between the reflective layer 110 and the second electrode 150 to which two first order resonators are connected. The phase correction layer 144 is disposed between the first partial transmission mirror 145 and the second partial transmission mirror 146 so that the resonance wavelength of the second order resonator is not shortened. The phase correction layer 144 may be located in a micro cavity between the reflective layer 110 and the second electrode 150 or at a node of a light wave resonating in the second order resonator. The first partial transmission mirror 145 and the second partial transmission mirror 146 may be disposed in direct contact with both surfaces of the phase correction layer 144.

The reflective layer 110, the second electrode 150, the first partial transmission mirror 145, and the second partial transmission mirror 146 may cause a phase modulation greater than 180 degrees to occur with respect to reflected light. The thickness D of the phase correction layer 144 may be determined in consideration of the phase modulation greater than 180 degrees of the reflective layer 110, the second electrode 150, the first partial transmission mirror 145, and the second partial transmission mirror 146. In particular, the thickness D of the phase correction layer 144 may be determined so that the resonance wavelengths of the two first order resonators and the resonance wavelength of the second order resonator match. For example, the thickness D of the phase correction layer 144 may be determined within a range of about 5 nm to about 150 nm. The phase correction layer 144 may include a transparent conductive material having a high refractive index.

Figure 13:
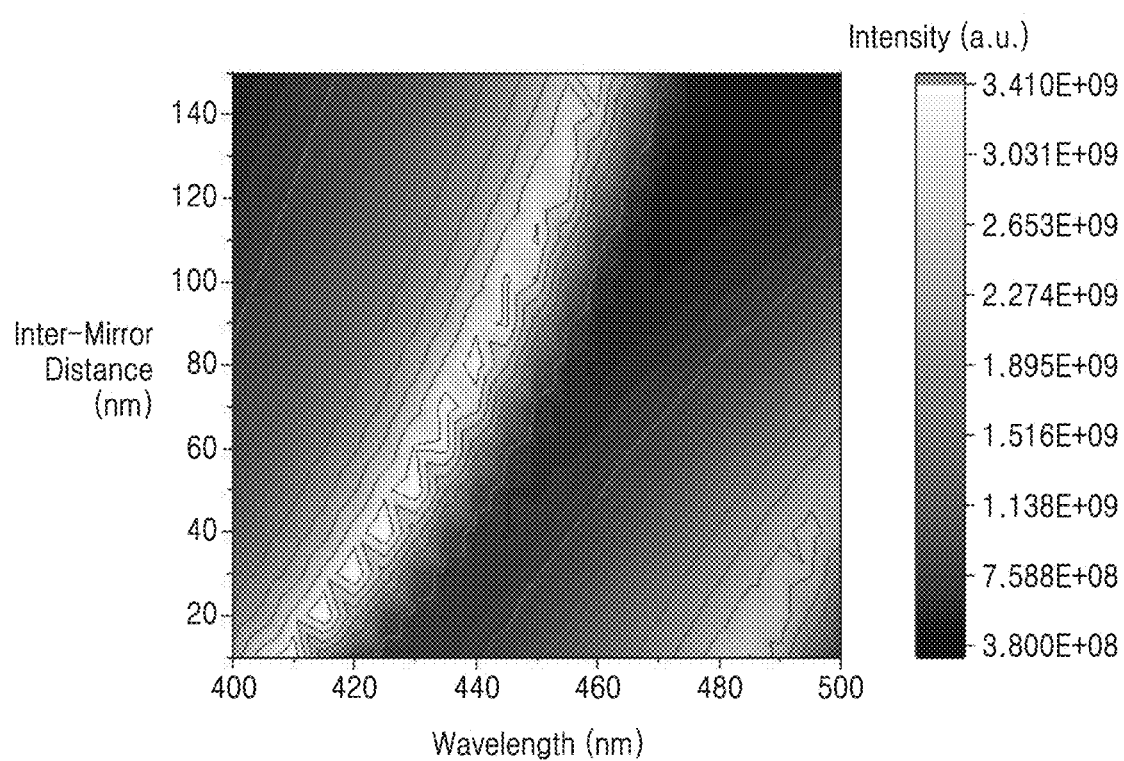
FIG. 13 illustrates an example of a change in a resonance wavelength of a second order resonator with respect to a change in the thickness of a phase correction layer in the light-emitting device shown in FIG. 11.

FIG. 13 illustrates an example of a change in a resonance wavelength of a second order resonator with respect to a change in the thickness of the phase correction layer 144 in the light-emitting device 240 shown in FIG. 11. Two first order resonators are designed to have a resonance wavelength of about 450 nm. The reflective layer 110 includes a silver thin film having a thickness of about 200 nm, each of the first partial transmission mirror 145 and the second partial transmission mirror 146 has a thickness of about 10 nm, and the second electrode 150 has a thickness of about 20 nm. A distance between the reflective layer 110 and the first partial transmission mirror 145 and a distance between the second partial transmission mirror 146 and the second electrode 150 are each fixed to about 168 nm. The resonance characteristics of the second order resonator is calculated while varying a phase correction distance, that is, the thickness of the phase correction layer 144 from about 10 nm to about 150 nm. Referring to FIG. 13, it may be seen that when the thickness of the phase correction layer 144 is about 10 nm, the resonance wavelength is formed at about 410 nm. As the thickness of the phase correction layer 144 increases, the resonance wavelength gradually increases, and when the thickness of the phase correction layer 144 is about 90 nm, a resonance wavelength of about 450 nm is formed.

Figure 14:
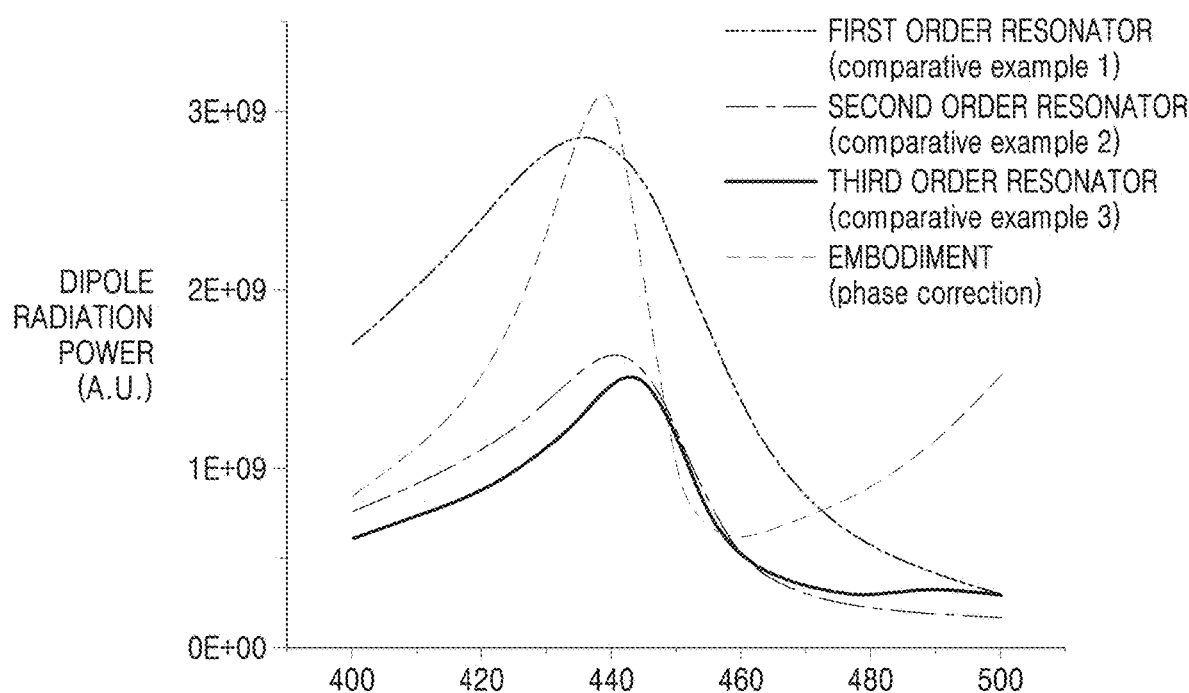
FIG. 14 is a graph illustrating an example of a change in emission characteristics of an illuminant with respect to a resonance order in the light-emitting device shown in FIG. 11 compared with comparative examples.

FIG. 14 is a graph illustrating an example of a change in emission characteristics of an illuminant with respect to a resonance order in the light-emitting device 240 shown in FIG. 11 compared with comparative examples. The graph of FIG. 14 shows the intensity of light generated by the illuminant positioned in a micro cavity compared to comparative examples. Referring to FIG. 14, it may be seen that the intensity of the light generated by the illuminant decreases as the resonance order increases from a first order resonance mode to a second order resonance mode and to a third order resonance mode. Meanwhile, it may be seen that the emission characteristics of the illuminant according to the embodiment are further improved compared to the case of having only a first order resonance mode. As described above, the phase correction layer 144 is disposed in consideration of a phase delay due to a metal constituting the reflective layer 110, the second electrode 150, the first partial transmission mirror 145, and the second partial transmission mirror 146, and thus, even when the phase delay is greater than 180 degrees in the reflective layer 110, the second electrode 150, the first partial transmission mirror 145, and the second partial transmission mirror 146, all of first or higher order resonance conditions are satisfied, thereby improving the emission efficiency of the light-emitting device 240.

Figure 15:
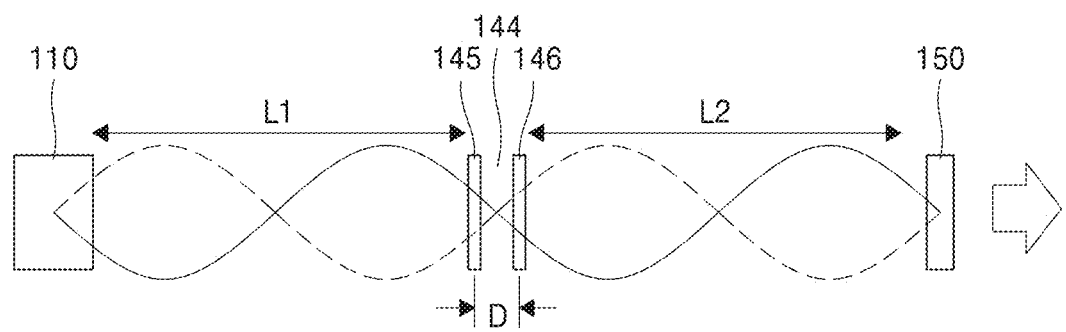
FIG. 15 is a conceptual diagram illustrating a micro cavity structure of a light-emitting device according to an embodiment.

In FIGS. 12A to 12C, it is described that the final micro cavity has a second order resonance mode by connecting two first order resonators. However, the disclosure is not necessarily limited thereto. For example, FIG. 15 is a conceptual diagram illustrating a micro cavity structure of a light-emitting device according to an embodiment. Referring to FIG. 15, a resonator formed between the reflective layer 110 and the first partial transmission mirror 145 is a second order resonator having a second order resonance mode. In addition, a resonator formed between the second partial transmission mirror 146 and the second electrode 150 is also a second order resonator having a second order resonance mode. As a result, the resonator formed between the reflective layer 110 and the second electrode 150 is a fourth order resonator having a fourth order resonance mode. In this case, the phase correction layer 144 may be located at a second node of a light wave resonating in the fourth order resonator.

As described above, the first partial transmission mirror 145 and the second partial transmission mirror 146 may be disposed so that a first or higher order resonance mode is formed between the reflective layer 110 and the first partial transmission mirror 145, and a second or higher resonance mode is formed between the reflective layer 110 and the second electrode 150, and the phase correction layer 144 having a certain thickness may be disposed between the first partial transmission mirror 145 and the second partial transmission mirror 146 for a phase correction. In addition, as shown in FIG. 15, an optical distance L1 between the reflective layer 110 and the first partial transmission mirror 145 may be selected so that the first or second order resonance mode is formed between the reflective layer 110 and the first partial transmission mirror 145, and an optical distance L2 between the second partial transmission mirror 146 and the second electrode 150 may also be selected so that the first or second order resonance mode is formed between the second partial transmission mirror 146 and the second electrode 150.

Meanwhile, the first emission layer 130a and the second emission layer 130b may have the same configuration as the first and second emission layers 130a and 130b previously described with reference to FIG. 1. For example, the first emission layer 130a may include a first hole transfer layer disposed on the first electrode 120, a first organic emission material layer disposed on the first hole transfer layer, and a first electron transfer layer disposed on the first organic emission material layer. In addition, the second emission layer 130b may include a second hole transfer layer disposed on the second partial transmission mirror 146, a second organic emission material layer disposed on the second hole transfer layer, and a second electron transfer layer disposed on the second organic emission material layer.

The first organic emission material layer in the first emission layer 130a and the second organic emission material layer in the second emission layer 130b may each include an organic material that generates light having the same wavelength. The optical distance L1 between the reflective layer 110 and the first partial transmission mirror 145 and the optical distance L2 between the second partial transmission mirror 146 and the second electrode 150 may be the same, and may be selected so that a resonance mode is formed with respect to a wavelength of light generated in the first and second organic emission material layers.

In an example, the first organic emission material layer in the first emission layer 130a may include an organic material that generates light of a first wavelength, and the second organic emission material layer in the second emission layer 130b may include an organic material that generates light of a second wavelength different from the first wavelength. In this case, the optical distance L1 between the reflective layer 110 and the first partial transmission mirror 145 may be selected so that a resonance mode with respect to the first wavelength is formed, and the optical distance L2 between the second partial transmission mirror 146 and the second electrode 150 may be selected so that a resonance mode with respect to the second wavelength is formed. In addition, the optical distance L between the reflective layer 110 and the second electrode 150 may be selected by adjusting the thickness of the phase correction layer 144 to have a resonance mode with respect to either wavelength selected from the first wavelength and the second wavelength. Or, the thickness of the phase correction layer 144 may be adjusted to have a resonance mode with respect to a third wavelength different from the first and second wavelengths. In this case, the light-emitting device 240 may emit a multi-colored light.

Although only two emission layers are shown in FIG. 11, a first partial transmission mirror, a phase correction layer, a second partial transmission mirror, and an emission layer may be further disposed between the second emission layer 130b and the second electrode 150. In this case, three emission layers may generate light of different wavelengths. Or, the three emission layers may generate light of the same wavelength.

Figure 16:
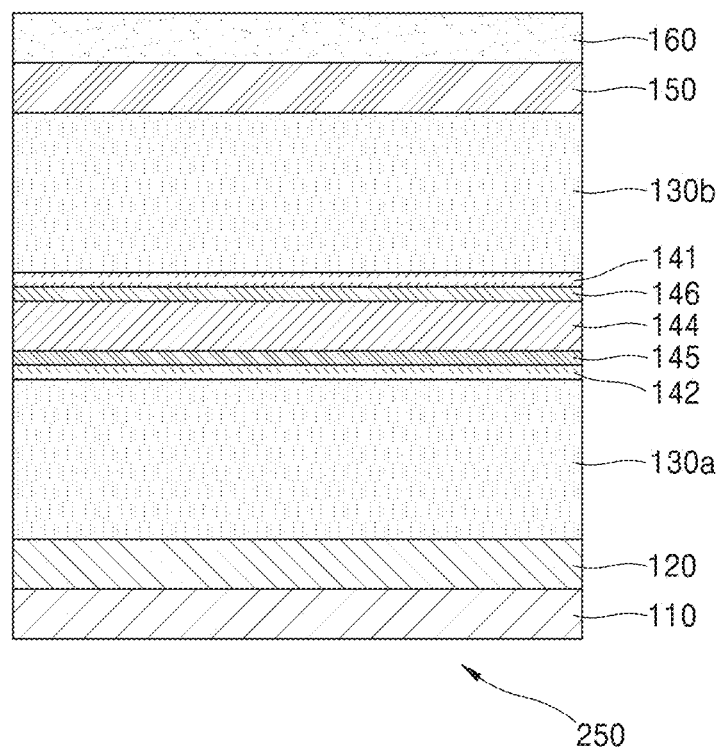
FIG. 16 is a cross-sectional view schematically illustrating a structure of a light-emitting device according to an embodiment.

FIG. 16 is a cross-sectional view schematically illustrating a structure of a light-emitting device 250 according to an embodiment. Referring to FIG. 16, the light-emitting device 250 may further include the transparent conductor layer 141 disposed between an upper surface of the second partial transmission mirror 146 and the second emission layer 130b. In addition, the light-emitting device 250 may further include the charge generation layer 142 disposed between the first emission layer 130a and the second emission layer 130b. Other configurations of the light-emitting device 250 shown in FIG. 16 are the same as those of the light-emitting device 240 shown in FIG. 11, and thus detailed descriptions thereof will be omitted.

Figure 17:
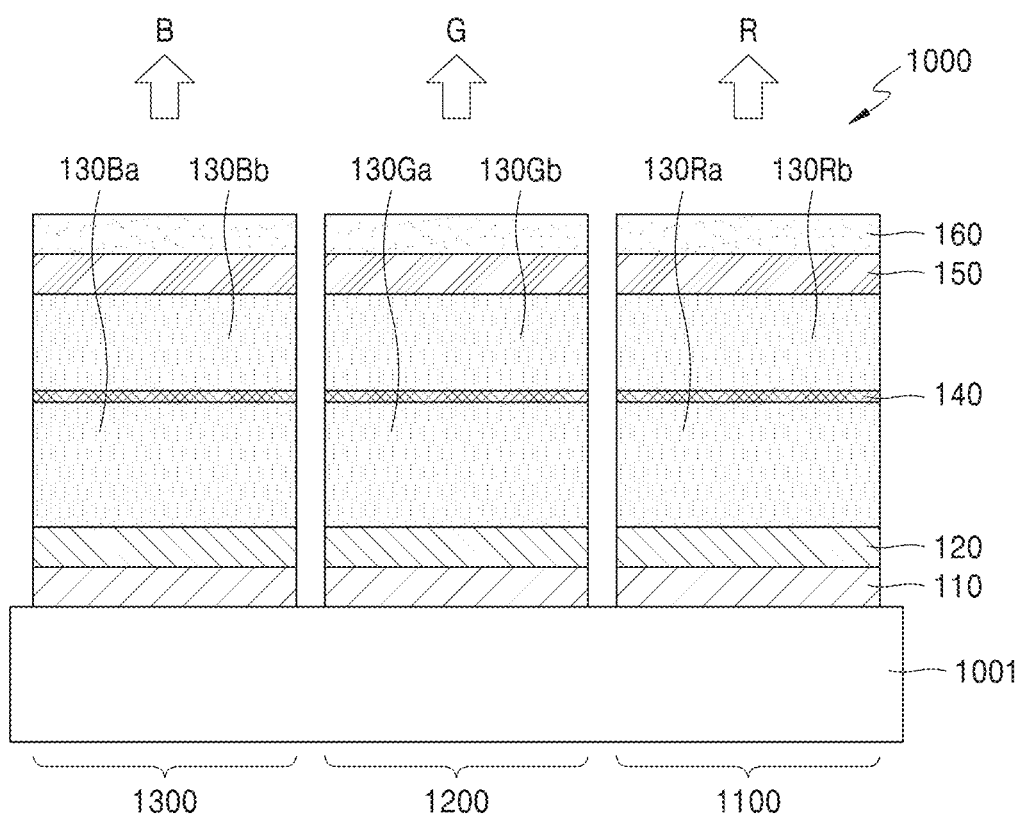
FIG. 17 is a cross-sectional view schematically illustrating a structure of a display apparatus according to an embodiment.

The above-described light-emitting devices may be applied to a plurality of pixels of a display apparatus. FIG. 17 is a cross-sectional view schematically illustrating a structure of a display apparatus 1000 according to an embodiment. Referring to FIG. 17, the display apparatus 1000 includes a plurality of pixels that emit light of different colors. Here, the plurality of pixels may include red, green, and blue pixels 1100, 1200, and 1300 disposed adjacent to each other on the same plane of a substrate 1001. In FIG. 17, only one unit pixel including the red, green, and blue pixels 1100, 1200, and 1300 is illustrated for convenience, but actually, a very large number of red, green, and blue pixels 1100, 1200, and 1300 may be repetitively arranged on the substrate 1001.

The red pixel 1100 may include the reflective layer 110 disposed on the substrate 1001, the first electrode 120 disposed on the reflective layer 110, the second electrode 150 disposed facing the first electrode 120, the partial transmission mirror 140 disposed between the first electrode 120 and the second electrode 150, a first red emission layer 130Ra disposed between the first electrode 120 and the partial transmission mirror 140 and a second red emission layer 130Rb between the partial transmission mirror 140 and the second electrode 150, and the passivation layer 160 disposed on the second electrode 150. An optical distance between the first electrode 120 and the partial transmission mirror 140 and an optical distance between the partial transmission mirror 140 and the second electrode 150 are determined to have a first or higher order resonance mode with respect to a red light, and an optical distance between the first electrode 120 and the second electrode 150 is determined to have a second or higher order resonance mode with respect to the red light.

The green pixel 1200 and the blue pixel 1300 have a structure similar to that of the red pixel 1100. The green pixel 1200 includes first and second green emission layers 130Ga and 130Gb instead of the red emission layers 130Ra and 130Rb, and the blue pixel 1300 includes first and second blue emission layers 130Ba and 130Bb instead of the red emission layers 130Ra and 130Rb. In the green pixel 1200, the optical distance between the first electrode 120 and the partial transmission mirror 140 and the optical distance between the partial transmission mirror 140 and the second electrode 150 are determined to have a first or higher order resonance mode with respect to a green light, and the optical distance between the first electrode 120 and the second electrode 150 is determined to have a second or higher order resonance mode with respect to the green light. In addition, in the blue pixel 1300, the optical distance between the first electrode 120 and the partial transmission mirror 140 and the optical distance between the partial transmission mirror 140 and the second electrode 150 are determined to have a first or higher order resonance mode with respect to a blue light, and the optical distance between the first electrode 120 and the second electrode 150 is determined to have a second or higher order resonance mode with respect to the blue light.

In FIG. 17, the red, green, and blue pixels 1100, 1200, and 1300 are illustrated as having the same structures as the light-emitting device 200 shown in FIG. 1, but are not limited thereto. The display device 1000 may also apply not only the light-emitting device 200 shown in FIG. 1 but also the light-emitting devices 210, 220, 230, 240 and 250 according to the other embodiments to the red, green, and blue pixels 1100, 1200, and 1300.

The above-described light-emitting device and display apparatus may be applied to devices of various sizes and various uses without limitation. For example, the above-described light-emitting device and display apparatus may be applied to a display panel of a mobile phone or a smart phone, may be applied to a display panel of a tablet or smart tablet, may be applied to a display panel of a notebook computer, television, or smart television, or may be applied to a small display panel used in a head mounted display, a glasses type display, a goggle type display, etc.

The above-described light-emitting device and display apparatus may be applied to devices of various sizes and various uses without limitation. For example, the above-described light-emitting device and display apparatus may be applied to a display panel of a mobile phone or a smart phone, may be applied to a display panel of a tablet or smart tablet, may be applied to a display panel of a notebook computer, television, or smart television, or may be applied to a small display panel used in a head mounted display, a glasses type display, a goggle type display, etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:
a reflective layer;
a first electrode provided on the reflective layer;
a second electrode facing the first electrode;
a phase correction layer provided between the first electrode and the second electrode;
a first emission layer provided between the first electrode and the second electrode;
a second emission layer provided between the first emission layer and the second electrode, and
a first partial transmission mirror provided between the first emission layer and the second emission layer so that a first or higher order resonance mode is formed between the reflective layer and the first partial transmission mirror, and a second or higher order resonance mode is formed between the reflective layer and the second electrode, the first partial transmission mirror being in direct contact with a surface of the phase correction layer,
wherein the first emission layer and the second emission layer generate light in a wavelength range of same color.

2. The light-emitting device of claim 1, wherein the first electrode comprises a transparent electrode and the second electrode comprises a partial transmission electrode that reflects a part of light and transmits another part of the light.

3. The light-emitting device of claim 1, wherein the reflective layer and the second electrode constitute a micro cavity having a resonance wavelength, and
wherein the first partial transmission mirror is provided at a node of a light wave resonating within the micro cavity.

4. The light-emitting device of claim 1, wherein the first partial transmission mirror comprises silver (Ag), aluminum (Al), silver alloy, or aluminum alloy.

5. The light-emitting device of claim 4, wherein a thickness of the first partial transmission mirror is about 5 nm to about 30 nm.

6. The light-emitting device of claim 5, wherein a thickness of the second electrode is different from the thickness of the first partial transmission mirror.

7. The light-emitting device of claim 1, wherein the first emission layer comprises:
a first hole transfer layer provided on the first electrode;
a first organic emission material layer provided on the first hole transfer layer; and
a first electron transfer layer provided on the first organic emission material layer, and
wherein the second emission layer comprises:
a second hole transfer layer provided on the first partial transmission mirror;
a second organic emission material layer provided on the second hole transfer layer; and
a second electron transfer layer provided on the second organic emission material layer.

8. The light-emitting device of claim 1, further comprising a transparent conductor layer on the first partial transmission mirror to face the second electrode.

9. The light-emitting device of claim 1, further comprising a charge generation layer provided between the first emission layer and the second emission layer.

10. The light-emitting device of claim 1, further comprising:
a third emission layer provided between the second emission layer and the second electrode; and
a second partial transmission mirror provided between the second emission layer and the third emission layer.

11. The light-emitting device of claim 10, wherein the first partial transmission mirror and the second partial transmission mirror are arranged so that a first order resonance mode is formed between the reflective layer and the first partial transmission mirror, a second order resonance mode is formed between the reflective layer and the second partial transmission mirror, and a third order resonance is formed between the reflective layer and the second electrode.

12. The light-emitting device of claim 11, wherein the reflective layer and the second electrode constitute a micro cavity having a resonance wavelength,
wherein the first partial transmission mirror is provided at a first node of a light wave resonating in the micro cavity, and
wherein the second partial transmission mirror is provided at a second node of the light wave resonating in the micro cavity.

13. A light-emitting device comprising:
a reflective layer;
a first electrode on the reflective layer;
a second electrode facing the first electrode;
a phase correction layer provided between the first electrode and the second electrode;
a first emission layer provided between the first electrode and the phase correction layer;
a second emission layer provided between the phase correction layer and the second electrode;
a first partial transmission mirror provided between the phase correction layer and the first emission layer, the first partial transmission mirror being in direct contact with a lower surface of the phase correction layer; and
a second partial transmission mirror provided between the phase correction layer and the second emission layer, the second partial transmission layer being in direct contact with an upper surface of the phase correction layer, wherein the first partial transmission mirror and the second partial transmission mirror are in layers vertically spaced from each other,
wherein the first partial transmission mirror and the second partial transmission mirror are arranged such that a first or higher order resonance mode is formed between the reflective layer and the first partial transmission mirror, and a second or higher order resonance mode is formed between the reflective layer and the second electrode,
wherein the first emission layer and the second emission layer generate light in a wavelength range of same color.

14. The light-emitting device of claim 13, wherein the first electrode comprises a transparent electrode and the second electrode comprises a partial transmission electrode that reflects a part of light and transmits another part of the light.

15. The light-emitting device of claim 13, wherein the reflective layer and the second electrode constitute a micro cavity having a resonance wavelength, and
wherein the phase correction layer is located at a node of a light wave resonating within the micro cavity.

16. The light-emitting device of claim 13, wherein the reflective layer, the second electrode, the first partial transmission mirror, and the second partial transmission mirror cause a phase modulation greater than 180 degrees to occur with respect to light reflected by the reflective layer, the second electrode, the first partial transmission mirror, and the second partial transmission mirror.

17. The light-emitting device of claim 13, wherein the phase correction layer comprises a transparent conductive material.

18. The light-emitting device of claim 17, wherein a thickness of the phase correction layer is about 5 nm to about 150 nm.

19. The light-emitting device of claim 13, wherein each of the first partial transmission mirror and the second partial transmission mirror comprises silver (Ag), aluminum (Al), silver alloy, or aluminum alloy.

20. The light-emitting device of claim 19, wherein each of the first partial transmission mirror and the second partial transmission mirror has a thickness of about 5 nm to about 30 nm.

21. The light-emitting device of claim 13, wherein an optical distance between the reflective layer and the first partial transmission mirror is set so that a first or second order resonance mode is formed between the reflective layer and the first partial transmission mirror, and
wherein an optical distance between the second partial transmission mirror and the second electrode is set so that the first or second order resonance mode is formed between the second partial transmission mirror and the second electrode.

22. The light-emitting device of claim 13,
wherein the first emission layer comprises:
a first hole transfer layer provided on the first electrode;
a first organic emission material layer provided on the first hole transfer layer; and
a first electron transfer layer provided on the first organic emission material layer, and
wherein the second emission layer comprises:
a second hole transfer layer provided on the second partial transmission mirror;
a second organic emission material layer provided on the second hole transfer layer; and
a second electron transfer layer provided on the second organic emission material layer.

23. The light-emitting device of claim 22, wherein the first organic emission material layer and the second organic emission material layer generate light of a same wavelength.

24. The light-emitting device of claim 23, wherein an optical distance between the reflective layer and the first partial transmission mirror is set so that a resonance mode is formed with respect to a wavelength of light generated from the first organic emission material layer, and
wherein an optical distance between the second partial transmission mirror and the second electrode is set so that a resonance mode is formed with respect to a wavelength of light generated from the second organic emission material layer.

25. A display apparatus comprising:
a plurality of pixels emitting light of a different color,
wherein each of the plurality of pixels comprises:
a reflective layer;
a first electrode provided on the reflective layer;
a second electrode facing the first electrode;
a phase correction layer provided between the first electrode and the second electrode;
a first emission layer provided between the first electrode and the second electrode;
a second emission layer provided between the first emission layer and the second electrode; and
a partial transmission mirror provided between the first emission layer and the second emission layer so that a first or higher order resonance mode is formed between the reflective layer and the partial transmission mirror, and a second or higher order resonance mode is formed between the partial transmission mirror and the second electrode, the partial transmission mirror being in direct contact with a surface of the phase correction layer
wherein the first emission layer and the second emission layer generate light in a wavelength range of same color.

* * * * *